United States Patent
Shiokawa et al.

(10) Patent No.: US 10,593,868 B2
(45) Date of Patent: *Mar. 17, 2020

(54) SPIN CURRENT MAGNETIZATION ROTATING ELEMENT, MAGNETORESISTIVE EFFECT ELEMENT AND MAGNETIC MEMORY

(71) Applicant: TDK CORPORATION, Tokyo (JP)

(72) Inventors: Yohei Shiokawa, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/091,240

(22) PCT Filed: Jan. 26, 2018

(86) PCT No.: PCT/JP2018/002516
§ 371 (c)(1),
(2) Date: Oct. 4, 2018

(87) PCT Pub. No.: WO2018/155078
PCT Pub. Date: Aug. 30, 2018

(65) Prior Publication Data
US 2019/0131517 A1    May 2, 2019

(30) Foreign Application Priority Data
Feb. 27, 2017 (JP) ................. 2017-034757

(51) Int. Cl.
*H01L 43/04* (2006.01)
*H01L 43/02* (2006.01)
(Continued)

(52) U.S. Cl.
CPC ............ *H01L 43/02* (2013.01); *G11C 11/161* (2013.01); *G11C 11/1675* (2013.01);
(Continued)

(58) Field of Classification Search
CPC ....................................... G11C 11/02
See application file for complete search history.

(56) References Cited

U.S. PATENT DOCUMENTS 8,350,347 B2    1/2013 Gaudin et al.
2014/0056060 A1    2/2014 Khvalkovskiy et al.
(Continued)

FOREIGN PATENT DOCUMENTS

JP    2014-045196 A    3/2014
WO    2016/021468 A1    2/2016
(Continued)

OTHER PUBLICATIONS

Apr. 10, 2018 International Search Report issued in International Patent Application No. PCT/JP2018/002516.
(Continued)

*Primary Examiner* — Cheung Lee
(74) *Attorney, Agent, or Firm* — Oliff PLC

(57) ABSTRACT

A spin current magnetization rotating element of the present disclosure includes a first ferromagnetic metal layer and a spin-orbit torque wiring, in which the spin-orbit torque wiring has a structure in which spin conduction layers and interface spin generation layers are alternately laminated, and one of the spin conduction layers is in closest proximity to the first ferromagnetic metal layer.

19 Claims, 2 Drawing Sheets

(51) Int. Cl.
| | |
|---|---|
| H01L 43/10 | (2006.01) |
| H01L 27/22 | (2006.01) |
| H01F 10/32 | (2006.01) |
| G11C 11/16 | (2006.01) |
| H01L 21/8239 | (2006.01) |
| H01L 43/08 | (2006.01) |
| H01L 43/12 | (2006.01) |

(52) U.S. Cl.
CPC ....... *H01F 10/329* (2013.01); *H01F 10/3254* (2013.01); *H01F 10/3286* (2013.01); *H01L 21/8239* (2013.01); *H01L 27/222* (2013.01); *H01L 43/04* (2013.01); *H01L 43/08* (2013.01); *H01L 43/10* (2013.01); *H01L 43/12* (2013.01)

(56) References Cited

U.S. PATENT DOCUMENTS

| | | |
|---|---|---|
| 2015/0348606 A1 | 12/2015 | Buhrman et al. |
| 2017/0222135 A1 | 8/2017 | Fukami et al. |
| 2019/0131517 A1 | 5/2019 | Shiokawa et al. |

FOREIGN PATENT DOCUMENTS

| | | |
|---|---|---|
| WO | 2017/155510 A1 | 9/2017 |
| WO | 2018/155078 A1 | 8/2018 |

OTHER PUBLICATIONS

Zhang et al; "Spin Hall Effects in Metallic Antiferromagnets;" Physical Review Letters; vol. 113; pp. 196602-1-196602-6; Nov. 4, 2014.

Seo et al; "Area-Efficient SOT-MRAM With a Schottky Diode;" IEEE Electron Device Letters; vol. 37; No. 8; pp. 982-985; Aug. 2016.

Takahashi et al; "Spin injection and detection in magnetic nanostructures;" Physical Review B; vol. 67; pp. 052409-1-052409-4; Feb. 28, 2003.

Fukami et al; "Magnetization switching by spin-orbit torque in an antiferromagnet-ferromagnet bilayer system;" Nature Materials; vol. 15; pp. 535-542; Feb. 15, 2016.

Lee et al; "Thermally activated switching of perpendicular magnet by spin-orbit spin torque;" Applied Physics Letters; vol. 104; 072413-1-072413-5; Feb. 21, 2014.

Lee et al; "Threshold current for switching of a perpendicular magnetic layer induced by spin Hall effect;" Applied Physics Letters; vol. 102; Mar. 25, 2013.

Liu et al; "Current-Induced Switching of Perpendicularly Magnetized Magnetic Layers Using Spin Torque from the Spin Hall Effect;" Physical Review Letters; vol. 109; pp. 096602-1-096602-5; Aug. 29, 2012.

Liu et al; "Spin torque switching with the giant spin Hall effect of tantalum;" Science; vol. 336; 2012.

Kato et al; "Observation of the Spin Hall Effect in Semiconductors;" Science; vol. 306; pp. 1910-1913; 2004.

Sinova et al; "Spin Hall effects;" Reviews of Modern Physics; vol. 87; No. 4; pp. 1213-1259; Oct. 27, 2015.

Fukami et al; "A spin-orbit torque switching scheme with collinear magnetic easy axis and current configuration;" Nature Nanotechnology; pp. 1-6; Mar. 21, 2016.

Miron et al; "Perpendicular switching of a single ferromagnetic layer induced by in-plane current injection;" Nature; vol. 476; pp. 189-193; Aug. 11, 2011.

Oct. 30, 2019 Search Report issued in European Patent Application No. 18757900.8.

SPIN CURRENT MAGNETIZATION ROTATING ELEMENT, MAGNETORESISTIVE EFFECT ELEMENT AND MAGNETIC MEMORY

TECHNICAL FIELD

The present disclosure relates to a spin current magnetization rotating element, more particularly to a spin current magnetization reversal element, and also to a magnetoresistive effect element and a magnetic memory.

Priority is claimed on Japanese Patent Application No. 2017-034757, filed Feb. 27, 2017, the content of which is incorporated herein by reference.

BACKGROUND ART

A giant magnetoresistive (GMR) element formed of a multilayer film including a ferromagnetic layer and a nonmagnetic layer, and a tunnel magnetoresistive (TMR) element in which an insulating layer (a tunnel barrier layer, a barrier layer) is used as a nonmagnetic layer are known. Generally, although a TMR element has a higher element resistance as compared with a GMR element, a magnetoresistance (MR) ratio of a TMR element is larger than an MR ratio of a GMR element. Therefore, attention has been focused on a TMR element as an element for magnetic sensors, high frequency components, magnetic heads, and magnetic random access memories (MRAMs).

In an MRAM, data is read and written by utilizing characteristics in which the element resistance of a TMR element changes as magnetization directions of two ferromagnetic layers sandwiching an insulating layer change. As a writing method of MRAMs, a method of performing writing (magnetization reversal) by utilizing a magnetic field generated by a current, and a method of performing writing (magnetization reversal) by utilizing a spin transfer torque (STT) generated by causing a current to flow in a lamination direction of a magnetoresistive effect element are known. Although the magnetization reversal of the TMR element using an STT is efficient when considered from the viewpoint of energy efficiency, a reversal current density for causing magnetization reversal is high. From the viewpoint of a long life span of the TMR element, it is preferable that the reverse current density be low. The same applies for GMR elements.

In recent years, attention has been focused on a magnetization reversal method in which a pure spin current generated by a spin Hall effect is utilized as a means for reducing the reversal current in a mechanism that is different from an STT (for example, see Non-Patent Document 1). A pure spin current generated by the spin Hall effect induces a spin-orbit torque (SOT) and the SOT causes magnetization reversal to occur. The pure spin current is generated when the same number of upward spin electrons and downward spin electrons flow in opposite directions to each other, and thus flows of electric charge cancel out. Therefore, a current flowing through the magnetoresistive effect element is zero, and thereby realization of a magnetoresistive effect element with a small reversal current density can be expected.

According to Non-Patent Document 2, it is reported that a reversal current density using the SOT method is approximately the same as a reversal current density using the STT method. However, the reversal current density reported in the present SOT method is insufficient for realizing high integration and low energy consumption, and there is room for improvement.

As a material used for a spin-orbit torque wiring (a wiring which induces an SOT to generate a pure spin current) of the magnetoresistive effect element in an SOT method, heavy metal materials such as Ta as used in Non-Patent Document 2 are exemplary examples. Since such heavy metal materials have a high electrical resistivity, high power consumption is also a problem when thin metal or a thin wire is used.

Non-Patent Document 1

I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011).

Non-Patent Document 2

S. Fukami, T. Anekawa, C. Zhang, and H. Ohno, Nature Nanotechnology, DOI: 10.1038/NNANO.2016.29.

Non-Patent Document 3

J. Sinova, S. O. Valenzuela, J. Wunderlich, C. H. Back, T. Jungwirth, Reviews of Modern Physics, 87, 1213 (2015)

SUMMARY

The present disclosure has been made in view of the above-described problems, and it is an object of the present disclosure to reduce a current density in magnetization rotation or magnetization reversal by an SOT method as compared with that in a conventional technology, and furthermore, to reduce power consumption.

The present inventors have taken particular note of an interface Rashba effect that occurs at an interface between different materials among various types of principle that can be considered as a cause of occurrence of an SOT, and have conceived of a configuration in which the number of interfaces is increased and a material of low resistance is used in order to efficiently utilize the interface Rashba effect.

Therefore, the present disclosure provides the following means to solve the above problems.

(1) A spin current magnetization rotating element according to one aspect of the present disclosure includes a first ferromagnetic metal layer in which a magnetization direction changes, and a spin-orbit torque wiring extending in a second direction intersecting a first direction which is a direction perpendicular to a surface of the first ferromagnetic metal layer and having one surface on which the first ferromagnetic metal layer is positioned, in which the spin-orbit torque wiring has a structure in which a spin conduction layer and an interface spin generation layer are alternately laminated in the first direction, and one of the spin conduction layers in the spin-orbit torque wiring is in closest proximity to the first ferromagnetic metal layer. Further, the spin current magnetization rotating element according to an aspect of the present disclosure includes a first ferromagnetic metal layer in which a magnetization direction changes, and a spin-orbit torque wiring extending in a second direction intersecting a first direction which is a direction perpendicular to a surface of the first ferromagnetic metal layer and joined to the first ferromagnetic metal layer, in which the spin-orbit torque wiring has a structure in which a spin conduction layer and an interface spin generation layer are alternately laminated in the first direction, and one of the spin conduction layers is joined to the first ferromagnetic metal layer.

(2) In the spin current magnetization rotating element according to (1) described above, the thickness of the interface spin generation layer is equal to or less than twice an atomic radius of atoms forming the interface spin generation layer.

(3) In the spin current magnetization rotating element according to (1) or (2) described above, the spin conduction layer is formed of a material containing at least any one element selected from the group consisting of Al, Si, Cu, Ag, GaAs, and Ge.

(4) In the spin current magnetization rotating element according to any one of (1) to (3) described above, the interface spin generation layer is formed of a material containing any one element selected from the group consisting of Mo, Ru, Rh, Pd, Ta, W, Ir, Pt, Au, or Bi.

(5) In the spin current magnetization rotating element according to any one of (1) to (4) described above, a thickness of the spin conduction layer is a thickness equal to or less than the spin diffusion length of the spin conduction layer.

(6) In the spin current magnetization rotating element according to one of (1) to (5) described above, the spin-orbit torque wiring includes two or more layers of the interface spin generation layers.

(7) In the spin current magnetization rotating element according to one of (1) to (6) described above, the thickness of the interface spin generation layer at a position closest to the first ferromagnetic metal layer is smaller than the thickness of the other interface spin generation layers in the interface spin generation layers.

(8) In the spin current magnetization rotating element according to any one of (1) to (7) described above, the spin conduction layers sandwiching the interface spin generation layer is formed of materials different from each other, and a spin resistivity of the spin conduction layer close to the first ferromagnetic metal layer is smaller than a spin resistivity of the spin conduction layer which is distant from the first ferromagnetic metal layer.

(9) In the spin current magnetization rotating element according to any one of (1) to (8) described above, the thickness of the spin-orbit torque wiring is equal to or less than 20 nm.

(10) A magnetoresistive effect element according to one aspect of the present disclosure includes the spin current magnetization rotating element according to any one of (1) to (9) described above, a second ferromagnetic metal layer in which a magnetization direction is fixed, and a nonmagnetic material layer sandwiched between a first ferromagnetic metal layer and the second ferromagnetic metal layer.

(11) A magnetic memory according to one aspect of the present disclosure includes a plurality of magnetoresistive effect elements according to (10) described above.

According to the spin current magnetization rotating element of the present disclosure, it is possible to provide a spin current magnetization rotating element capable of generating magnetization rotation by a pure spin current efficiently using the interface Rashba effect.

DESCRIPTION OF EMBODIMENTS

Figure 1A:
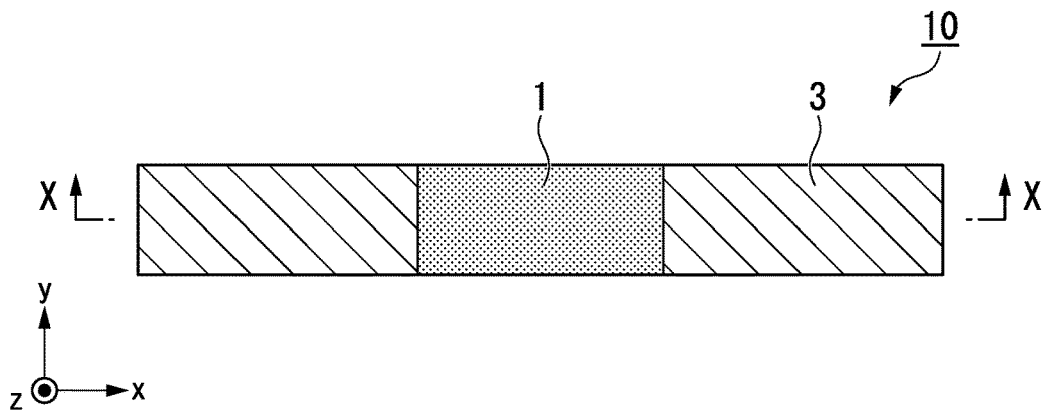
FIG. 1A is a schematic view showing a spin current magnetization rotating element according to one embodiment of the present disclosure, and is a plan view of the spin current magnetization rotating element.

Hereinafter, the present disclosure will be described in detail with reference to the drawings as appropriate. In the drawings used in the following description, there are cases in which characteristic portions are appropriately enlarged for convenience of illustration so that characteristics of the present disclosure can be easily understood, and dimensional proportions of respective constituent elements may be different from actual ones. Materials, dimensions, and the like provided in the following description are merely examples, and the present disclosure is not limited thereto and can be implemented with appropriate modifications within a range in which the effects of the present disclosure are achieved. In the elements of the present disclosure, other layers may be provided within a range of achieving effects of the present disclosure.

(Spin Current Magnetization Rotating Element)

Figure 1B:
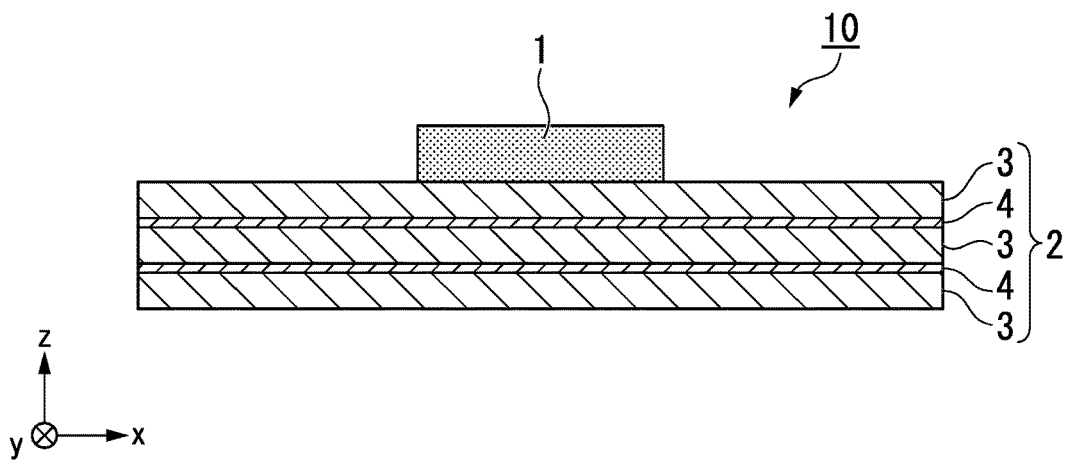
FIG. 1B is a schematic view showing the spin current magnetization rotating element according to one embodiment of the present disclosure, and is a cross-sectional view of the spin current magnetization rotating element of FIG. 1A.

FIGS. 1A and 1B are schematic views of an example of a spin current magnetization rotating element according to one embodiment of the present disclosure. FIG. 1A is a plan view, and FIG. 1B is a cross-sectional view taken along line X-X which is a central line in a width direction of the spin-orbit torque wiring 2 of FIG. 1A.

A spin current magnetization rotating element 10 shown in FIGS. 1A and 1B includes a first ferromagnetic metal layer 1 in which a magnetization direction changes, and the spin-orbit torque wiring 2 extending in a second direction intersecting a first direction which is a direction perpendicular to a surface of the first ferromagnetic metal layer and joined to the first ferromagnetic metal layer 1, in which the spin-orbit torque wiring 2 has a structure in which spin conduction layers 3 and interface spin generation layers 4 are alternately laminated in the first direction, and one of the spin conduction layers 3 is joined to the first ferromagnetic metal layer.

Hereinafter, a direction perpendicular to a surface of the first ferromagnetic metal layer 1 or a direction in which the first ferromagnetic metal layer 1 and the spin-orbit torque wiring 2 are laminated is a z direction (first direction), a direction perpendicular to the z direction and parallel to the spin-orbit torque wiring 2 is an x direction (second direction), and a direction perpendicular to the x direction and z direction is a y direction (third direction). Further, a direction perpendicular to a surface joined to the spin-orbit torque wiring 2 or a surface facing the spin-orbit torque wiring 2 in the first ferromagnetic metal layer 1 is referred to as a direction perpendicular to a surface of the first ferromagnetic metal layer 1. In addition, in the z direction (first direction), a direction facing the first ferromagnetic metal layer 1 from the spin-orbit torque wiring 2 is referred to as upward in the z direction, and a direction facing the first ferromagnetic metal layer 1 from the spin-orbit torque wiring 2 is referred to as downward in the z direction.

In the following description including FIGS. 1A and 1B, as an example of a configuration in which the spin-orbit torque wiring 2 extends in a direction intersecting the first direction which is the direction perpendicular to a surface of the first ferromagnetic metal layer 1, a configuration in which the spin-orbit torque wiring 2 extends in a direction perpendicular to the first direction will be described.

The spin current magnetization rotating element 10 of the present embodiment, that is, an element that performs magnetization rotation of a ferromagnetic metal layer using a spin-orbit torque (SOT) effect by a pure spin current can be used in a magnetoresistive effect element that performs magnetization reversal of a ferromagnetic metal layer using only an SOT using a pure spin current, and particularly in this case, the element can be regarded as a spin current magnetization reversal element. On the other hand, the spin current magnetization rotating element of the present embodiment can be used as an assisting means or main means for magnetization reversal of a ferromagnetic metal layer in a magnetoresistive effect element using a conventional spin transfer torque (STT).

<First Ferromagnetic Metal Layer>

The first ferromagnetic metal layer 1 contains a known ferromagnetic material so that a magnetization direction changes. Further details of the first ferromagnetic metal layer 1 will be described in connection with a first ferromagnetic metal layer 101 in an application of a magnetoresistive effect element described below.

<Spin-Orbit Torque Wiring>

The spin-orbit torque wiring 2 is configured such that a pure spin current is generated when a current flows and a spin orbit torque is induced. The spin-orbit torque wiring 2 of the present embodiment has a structure in which the spin conduction layers 3 and the interface spin generation layers 4 are alternately laminated in the first direction.

At respective interfaces between the spin conduction layers 3 and the interface spin generation layer 4, spin accumulation (a state in which either one of upward spins or downward spins is present in a large amount) due to an interface Rashba effect occurs. The spin accumulation causes a pure spin current to be generated.

Although a detailed mechanism of the interface Rashba effect is not clear, it is, however, thought to be as follows. At an interface between materials different from each other, spatial inversion symmetry is broken, and it is thought that a potential gradient is present in a direction perpendicular to a surface (direction perpendicular to the interface). When a current flows in such a direction perpendicular to the surface along the interface in which there is a potential gradient, that is, when electrons move in the two-dimensional surface, an effective magnetic field acts on spins in a direction perpendicular to a moving direction of the electrons and in an in-surface direction, and thus the spins align in a direction of the effective magnetic field. Thereby, spin accumulation is formed at the interface. Then, the spin accumulation causes a pure spin current that diffuses out of the surface to be generated.

In FIGS. 1A and 1B, when the first ferromagnetic metal layer 1, which is a ferromagnetic material, is brought into contact with an upper surface of the spin-orbit torque wiring 2, a pure spin current generated at the interface diffuses and is transmitted into the spin-orbit torque wiring 2, eventually reaches the first ferromagnetic metal layer 1, and diffuses and flows into the first ferromagnetic metal layer 1. That is, spins are injected into the first ferromagnetic metal layer 1.

In the spin current magnetization rotating element 10 of the present embodiment, by having such a configuration in which a current is caused to flow into the spin-orbit torque wiring 2 to cause a pure spin current to be generated and the pure spin current diffuses into the first ferromagnetic metal layer 1 which is in contact with the spin-orbit torque wiring 2, magnetization rotation of the first ferromagnetic metal layer 1 occurs due to the spin-orbit torque (SOT) effect due to the pure spin current. When the SOT effect is sufficiently large, magnetization of the first ferromagnetic metal layer 1 is reversed. In this case, the spin current magnetization rotating element of the present embodiment as described above can be particularly referred to as a spin current magnetization reversal element.

(Spin Conduction Layer)

The spin conduction layer 3 is formed of a material having a low electrical resistivity to lower electrical resistance and a long spin diffusion length (a distance at which spin accumulation dissipates) to conduct a spin current to the first ferromagnetic metal layer 1. As the material forming the spin conduction layer 3, a material containing at least one element of Al, Si, Cu, Ag, GaAs, and Ge is an exemplary example. An elemental material may be used for the spin conduction layer 3, or a material in combination such as an alloy, and a compound may be used for the spin conduction layer 3.

The thickness of the spin conduction layer 3 is preferably set to a thickness equal to or less than the spin diffusion length of the spin conduction layer 3. Thereby, it is possible to transmit a spin current to the first ferromagnetic metal layer 1 without losing spin information. The spin diffusion length depends particularly on a material used. For example, it is known that the spin diffusion lengths of elemental Cu and elemental Ag reach 100 nm or more at room temperature. In Non-Patent Document 3, it is reported that the spin diffusion length of crystalline elemental Cu extends up to 500 μm at room temperature, and the spin diffusion length of crystalline elemental Ag extends up to 700 μm at room temperature. Therefore, the thickness of the spin conduction layer 3 can be set to be sufficiently equal to or less than the spin diffusion length. Further, as described in Non-Patent Document 3, the spin diffusion lengths of various types of material are known to those skilled in the art or can be estimated, and those skilled in the art need to note that the thickness of the spin conduction layer can be set to be equal to or less than the spin diffusion length in the case of using various materials based on the disclosure of the present disclosure.

(Interface Spin Generation Layer)

The interface spin generation layer 4 is formed of a material that generates a large spin-orbit torque (SOT). As such materials, a nonmagnetic heavy metal such as a material containing at least one element of Mo, Ru, Rh, Pd, Ta, W, Ir, Pt, Au, and Bi is an example, and an elemental material may be used for the interface spin generation layers 4, or a material in combination such as an alloy, or a compound may be used for the interface spin generation layers 4.

The material (heavy metal) forming the interface spin generation layer 4 has a shorter spin diffusion length than the material (wiring material) forming the spin conduction layer 3. Therefore, the thickness of the interface spin generation layer 4 is made small so that a spin current passes through the interface spin generation layer 4 and reaches the first ferromagnetic metal layer 1 without losing spin information.

Particularly, the thickness of the interface spin generation layer 4 is set to be equal to or less than twice an atomic radius of the atom forming the interface spin generation layer 4. Here, the atomic radius means half of a minimum interatomic distance in an elemental crystal, as generally recognized by those skilled in the art.

Further, a thickness equal to or less than twice an atomic radius includes a case in which the thickness is the thickness of a monoatomic layer corresponding exactly to the thickness of twice the atomic radius, and a case in which the thickness is less than the thickness of the monoatomic layer. Here, a thickness less than the thickness of the monoatomic layer means that the layer has a defect, that is, a hole is open, and the average thickness of the entire layer is less than twice the atomic radius. In the interface spin generation layer 4 in which such a hole is opened, a spin current is easily conducted via the hole and is easily generated. In other words, the interface spin generation layer 4 may not form a complete layer, and may be a layer included in the spin conduction layer 3, for example, a layer doped in the spin conduction layer 3. In a case of such an ultra-thin interface spin generation layer 4, the interface spin generation layer 4 is formed of the above-described elemental material.

In order to allow a pure spin current to pass through the interface spin generation layer 4, not only the structure in which a thickness of the interface spin generation layer 4 is made small, but also other structures can be conceived. For example, as an alternative structure to the interface spin generation layer 4, a structure in which thin lines (strips) are arranged, a mesh-like structure, or a mechanically perforated structure can be conceived. Also in such a structure, a pure spin current can effectively pass through the interface spin generation layer 4. Particularly, the case in which the interface spin generation layer 4 is mechanically perforated is preferable because it is possible to control a position distribution of the perforations, that is, the flow of the spin current passing through the interface spin generation layer 4 can be controlled.

In FIGS. 1A and 1B, a five-layer structure is formed by alternately laminating three layers of the spin conduction layer 3 and two layers of the interface spin generation layer 4 (the spin conduction layer 3, the interface spin generation layer 4, the spin conduction layer 3, the interface spin generation layer 4, and the spin conduction layer 3, in order from a bottom of the drawing), and the spin conduction layer 3 positioned as an uppermost layer in the first direction (z direction) is joined to the first ferromagnetic metal layer 1. In such a five-layer structure or a structure with a greater number of layers (for example, seven-layer structures), there are two or more layers of interface spin generation layers 4, the number of interfaces is effectively increased, spin accumulation, that is, a spin current is increased, and thereby magnetization rotation (magnetization reversal) can be realized with a small current.

Figure 2A:
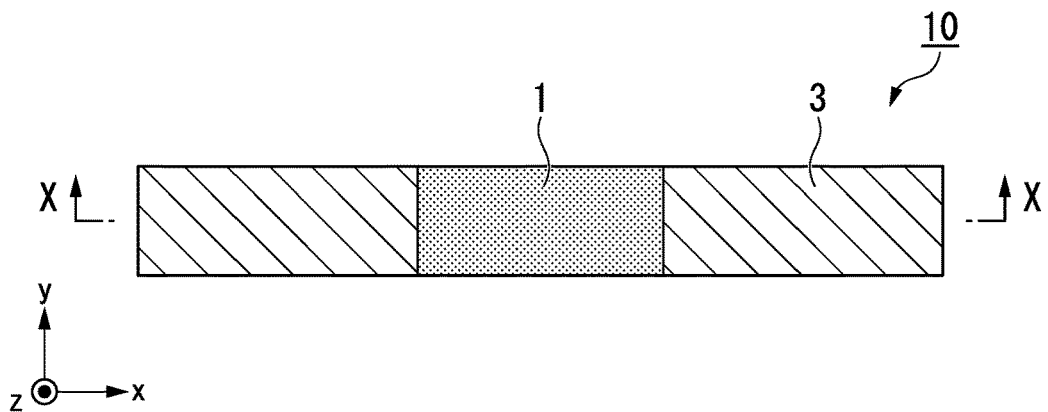
FIG. 2A is a schematic view showing a spin current magnetization rotating element according to another embodiment of the present disclosure, and is a plan view of the spin current magnetization rotating element.
Figure 2B:
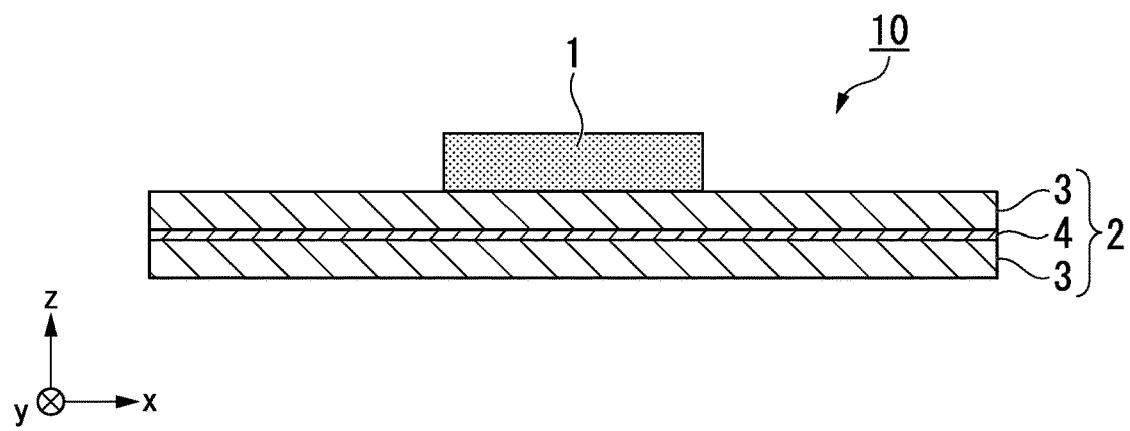
FIG. 2B is a schematic view showing the spin current magnetization rotating element according to another embodiment of the present disclosure, and is a cross-sectional view of the spin current magnetization rotating element of FIG. 2A.

However, the present disclosure is not limited to the above-described five-layer structure, and the number of spin conduction layers 3 and the number of interface spin generation layers 4 that are alternately laminated can be changed as long as one of the spin conduction layers 3 positioned as the uppermost layer (the spin conduction layer 3 positioned as the uppermost layer in the first direction (z direction)) is joined to the first ferromagnetic metal layer 1. That is, the spin-orbit torque wiring 2 may include at least one spin conduction layer 3 and at least one interface spin generation layer 4, and one of the spin conduction layers 3 may be joined (or in closest proximity) to the first ferromagnetic metal layer 1. For example, in another embodiment of the present disclosure shown in FIGS. 2A and 2B, a three-layer structure (a spin conduction layer 3, an interface spin generation layers 4, and a spin conduction layer 3 in order from a bottom of the drawing) is formed by alternately laminating two spin conduction layers 3 and one interface spin generation layer 4. Then, one of the spin conduction layers 3 (the spin conduction layer 3 positioned as an uppermost layer in a first direction (z direction)) is joined to a first ferromagnetic metal layer 1.

Also, in a laminated structure of the spin conduction layer 3 and the interface spin generation layer 4, the plurality of spin conduction layers 3 need not all have the same thickness, and similarly, the plurality of interface spin generation layers 4 may need not all have the same thickness. In other words, the plurality of spin conduction layers 3 may have different thicknesses, and the plurality of interface spin generation layers 4 may have different thicknesses. For example, when there are a plurality of interface spin generation layers 4, a thickness of the interface spin generation layer 4 at a position closest to the first ferromagnetic metal layer 1 (that is, an interface spin generation layer 4 positioned as an uppermost portion in the first direction (z direction) of the plurality of interface spin generation layers 4) may be smaller than thicknesses of the other interface spin generation layers 4. Here, in a case in which all the thicknesses of the plurality of interface spin generation layers 4 are equal to or less than twice an atomic radius, the fact that the thickness of one interface spin generation layer 4 is smaller than the thickness of the other interface spin generation layers 4 means that one interface spin generation layer 4 has more defects (holes). As a result, a pure spin current generated at respective interfaces between the other interface spin generation layers 4 and the spin conduction layers 3 positioned at a lower portion is accelerated in passing through the interface spin generation layer 4 positioned near the uppermost layer, conducting through the spin conduction layer 3 thereabove, and reaching the first ferromagnetic metal layer 1.

Further, all the plurality of spin conduction layers 3 may not be formed of the same material, and similarly, all the plurality of interface spin generation layers 4 may not be formed of the same material. In other words, the plurality of spin conduction layers 3 may be formed of different materials, or the plurality of the interface spin generation layers 4 may be formed of different materials. For example, two spin conduction layers 3 sandwiching one interface spin generation layer 4 can be formed of materials different from each other. In this case, materials are selected such that the spin resistivity (difficulty for a spin current to flow) of the spin conduction layer 3 close to the first ferromagnetic metal layer 1 (spin conduction layers positioned on an upper side in the first direction (z direction)) is smaller than the spin resistivity of the spin conduction layer 3 which is distant from the first ferromagnetic metal layer 1 (spin conduction layers positioned on a lower side in the first direction (z direction)). For example, since Cu has a higher spin resistivity than Ag, the spin conduction layer 3 close to the first ferromagnetic metal layer 1 is formed of Ag, and the spin conduction layer 3 which is distant from the first ferromagnetic metal layer 1 is formed of Cu. As a result, a pure spin current generated at the interface between the spin conduction layer 3 and the interface spin generation layer 4 positioned on a lower side is reflected by the material having a higher spin resistivity and then directed toward the first ferromagnetic metal layer 1 on the side above thereof.

Preferably, the thickness of each of the spin conduction layers 3 and the thickness of each of the interface spin generation layers 4 are set such that the thickness of the spin-orbit torque wiring 2, which is a laminated body of these layers, is equal to or less than 20 nm. When the thickness of the spin-orbit torque wiring 2 is more than 20 nm and becomes excessively thick, since a surface roughness between the spin-orbit torque wiring 2 and the first ferromagnetic metal layer 1 laminated thereon is increased, there is a likelihood that a magnetoresistive effect will become unstable. The thickness of the spin-orbit torque wiring 2 is preferably 1 nm or more, and more preferably 2 nm or more and 10 nm or less, but is not limited thereto.

The spin current magnetization rotating element 10 can further include an insulating layer joined to a surface of the spin-orbit torque wiring 2 on a side opposite to the surface to which the first ferromagnetic metal layer 1 is joined. When this configuration is applied to magnetoresistive effect elements or other applications, it is possible to prevent a current flowing in the spin-orbit torque wiring 2 from leaking from the surface on a side opposite to the surface to which the first ferromagnetic metal layer 1 is joined, and thereby a current concentration effect can be further enhanced.

In the above-described embodiment, a case in which the spin-orbit torque wiring is directly connected to the first ferromagnetic metal layer has been described, but another layer such as a cap layer may be interposed between the first ferromagnetic metal layer and the spin-orbit torque wiring as described below. That is, the first ferromagnetic metal layer may be positioned on one side of the spin-orbit torque wiring, and one of the spin conduction layers in the spin-orbit torque wiring may be configured to be in closest proximity to the first ferromagnetic metal layer. Further details of the cap layer will be described in connection with a cap layer 104 in an application of the magnetoresistive effect element to be described below.

The spin current magnetization rotating element of the present embodiment can be applied to magnetoresistive effect elements as described below. The present disclosure is not limited to a magnetoresistive effect element, and can be applied in other applications. As another application, for example, the above-described spin current magnetization rotating element can be arranged at each pixel to be used in a spatial light modulator in which incident light is spatially modulated using a magneto-optical effect, and a magnetic field applied to an axis of easy magnetization of a magnet may be replaced by an SOT in order to avoid a hysteresis effect due to a coercive force of a magnet in a magnetic sensor.

(Magnetoresistive Effect Element)

The magnetoresistive effect element according to one embodiment of the present disclosure includes a spin current magnetization rotating element according to the above-described embodiment of the present disclosure, a second ferromagnetic metal layer in which a magnetization direction is fixed, and a nonmagnetic layer sandwiched between the first ferromagnetic metal layer and the second ferromagnetic metal layer.

Figure 3:
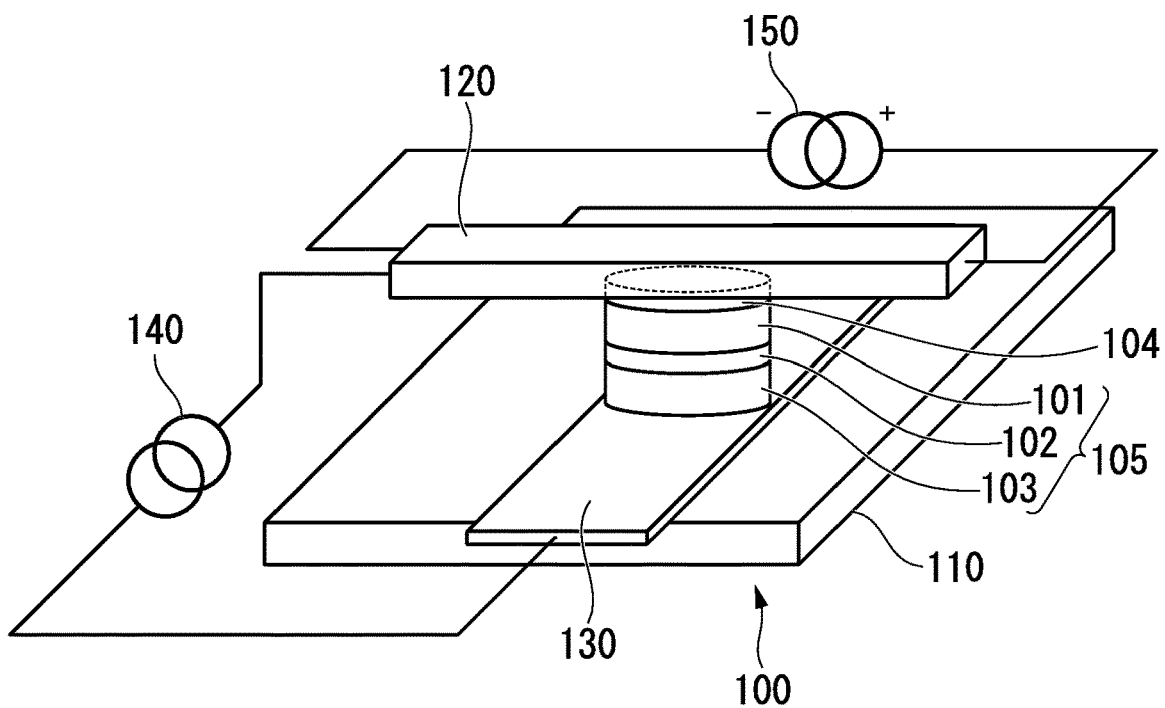
FIG. 3 is a perspective view schematically showing a magnetoresistive effect element according to one embodiment of the present disclosure.

FIG. 3 is an example of application of the spin current magnetization rotating element of the present disclosure, and also is a perspective view schematically showing the magnetoresistive effect element according to one embodiment of the present disclosure. Further, in FIG. 3, illustration of a characteristic portion of the spin current magnetization rotating element of the present disclosure is omitted.

A magnetoresistive effect element 100 shown in FIG. 3 includes a spin current magnetization rotating element (a first ferromagnetic metal layer 101 and a spin-orbit torque wiring 120) according to the above-described embodiment of the present disclosure, a second ferromagnetic metal layer 103 in which a magnetization direction is fixed, and a nonmagnetic layer 102 sandwiched between the first ferromagnetic metal layer 101 and the second ferromagnetic metal layer 103. The first ferromagnetic metal layer 101 has the same configuration as the above-described first ferromagnetic metal layer 1, and the spin-orbit torque wiring 120 has the same configuration as the above-described spin-orbit torque wiring 2. Further, the magnetoresistive effect element 100 shown in FIG. 3 can also be referred to as having a magnetoresistive effect element portion 105 (the first ferromagnetic metal layer 101, the nonmagnetic layer 102, and the second ferromagnetic metal layer 103) and the spin-orbit torque wiring 120.

Since the magnetoresistive effect element according to one embodiment of the present disclosure includes the spin-orbit torque wiring 120, it is possible to have a configuration in which magnetization reversal of the magnetoresistive effect element is performed using only an SOT using a pure spin current (hereinafter, may be referred to as a "SOT only" configuration), and it is also possible to have a configuration in which the SOT using a pure spin current is used in combination in a conventional magnetoresistive effect element using an STT.

In the following description including FIG. 3, as an example of a configuration in which the spin-orbit torque wiring 120 extends in a direction intersecting a lamination direction of the magnetoresistive effect element portion 105 a case in which the spin-orbit torque wiring 120 is configured to extend in a direction perpendicular to the lamination direction of the magnetoresistive effect element portion 105 will be described.

A wiring 130 for causing a current to flow in the lamination direction of the magnetoresistive effect element 100 and a substrate 110 for forming the wiring 130 are also shown in FIG. 3. Also, the magnetoresistive effect element 100 includes a cap layer 104 between the first ferromagnetic metal layer 101 and the spin-orbit torque wiring 120.

<Magnetoresistive Effect Element Portion>

The magnetoresistive effect element portion 105 includes a second ferromagnetic metal layer 103 in which a magnetization direction is fixed, a first ferromagnetic metal layer 101 in which a magnetization direction changes, and the nonmagnetic layer 102 sandwiched between the second ferromagnetic metal layer 103 and the first ferromagnetic metal layer 101.

The magnetization of the second ferromagnetic metal layer 103 is fixed in one direction, a direction of magnetization of the first ferromagnetic metal layer 101 changes relatively, and thereby the magnetoresistive effect element portion 105 functions as a magnetoresistive effect element. When it is applied to a coercivity-differed type (pseudo spin valve type) magnetic random access memory (MRAM), a coercivity of the second ferromagnetic metal layer is larger than a coercivity of the first ferromagnetic metal layer, and when it is applied to an exchange bias type (spin valve type) MRAM, a direction of magnetization in the second ferromagnetic metal layer is fixed due to exchange coupling with an antiferromagnetic layer.

Also, when the nonmagnetic layer 102 is formed of an insulator, the magnetoresistive effect element portion 105 is a tunneling magnetoresistance (TMR) element, and when the nonmagnetic layer 102 is formed of a metal, the magnetoresistive effect element portion 105 is a giant magnetoresistance (GMR) element.

For the magnetoresistive effect element portion 105 of the present embodiment, a configuration of a known magnetoresistive effect element portion can be employed. For example, each layer may be formed of a plurality of layers, or another layer such as an antiferromagnetic layer for fixing a direction of magnetization of the second ferromagnetic metal layer may be provided.

The second ferromagnetic metal layer 103 is called a fixed layer, a pinning layer, a pin layer, a reference layer, or the like and the first ferromagnetic metal layer 101 is called a free layer, a free layer, a storage layer, or the like.

The second ferromagnetic metal layer 103 and the first ferromagnetic metal layer 101 may be either an in-surface magnetization film of which a magnetization direction is an in-surface direction parallel to the layer or a perpendicular magnetization film of which a magnetization direction is a direction perpendicular to the layer.

For a material of the second ferromagnetic metal layer 103, a known material can be used. For example, a metal selected from a group consisting of Cr, Mn, Co, Fe and Ni, and an alloy containing one or more of these metals and exhibiting ferromagnetism can be used. It is also possible to use an alloy containing these metals and at least one of the elements B, C, and N. Specifically, Co—Fe and Co—Fe—B are exemplary examples.

Also, in order to obtain a higher output, it is preferable to use a Heusler alloy such as $Co_2FeSi$. A Heusler alloy contains an intermetallic compound having a chemical composition of $X_2YZ$, in which X indicates a transition metal element from the Co, Fe, Ni, or Cu groups, or a noble metal element in the Periodic Table, Y indicates a transition metal from the Mn, V, Cr, or Ti groups, or an element from the groups for X, and Z indicates a typical element from Group III to Group V. For example, $Co_2FeSi$, $Co_2MnSi$, $Co_2Mn_{1-a}Fe_aAl_bSi_{1-b}$, and the like are exemplary examples.

Also, in order to further increase a coercivity of the second ferromagnetic metal layer 103 with respect to the first ferromagnetic metal layer 101, an antiferromagnetic material layer such as IrMn, PtMn, or the like may be provided on a surface of the second ferromagnetic metal layer 103 on a side opposite to a surface with which the nonmagnetic layer 102 is in contact as a layer (a pinning layer) in contact with the second ferromagnetic metal layer 103. More specifically, such a layer may be provided between the second ferromagnetic metal layer 103 and the wiring 130. Further, in order to prevent a leakage magnetic field of the second ferromagnetic metal layer 103 from affecting the first ferromagnetic metal layer 101, a synthetic ferromagnetic coupling structure may also be employed.

In addition, when a direction of magnetization of the second ferromagnetic metal layer 103 is made perpendicular to a lamination surface, it is preferable to use a film in which Co and Pt are laminated. Specifically, the second ferromagnetic metal layer 103 can be formed of [Co (0.24 nm)/Pt (0.16 nm)]$_6$/Ru (0.9 nm)/[Pt (0.16 nm)/Co (0.16 nm)]$_4$/T (0.2 nm)/FeB (1.0 nm).

As a material of the first ferromagnetic metal layer 101, a ferromagnetic material, particularly a soft magnetic material, can be applied. For example, a metal selected from the group consisting of Cr, Mn, Co, Fe and Ni, an alloy containing one or more of these metals, and an alloy containing these metals and at least one of the elements B, C, and N, or the like can be used. Specifically, Co—Fe, Co—Fe—B, and Ni—Fe are exemplary examples.

When a direction of magnetization of the first ferromagnetic metal layer 101 is made perpendicular to the lamination surface, the first ferromagnetic metal layer is preferably formed to have a thickness of 2.5 nm or less. Thereby, perpendicular magnetic anisotropy can be added to the first ferromagnetic metal layer 101 at an interface between the first ferromagnetic metal layer 101 and the nonmagnetic layer 102. Also, since an effect of the perpendicular magnetic anisotropy is attenuated when the film thicknesses of the first ferromagnetic metal layer 101 increases, the film thickness of the first ferromagnetic metal layer 101 is preferably small. Further, the thickness of the first ferromagnetic metal layer is preferably 0.5 nm or more, and more preferably 0.5 nm or more and 2.0 nm or less, but is not limited thereto.

For the nonmagnetic layer 102, a known material can be used. For example, when the nonmagnetic layer 102 is formed of an insulator (that is, in a case of a tunnel barrier layer), $Al_2O_3$, $SiO_2$, Mg, $MgAl_2O_4$, or the like can be used as the material. In addition to these materials, a material in which some of Al, Si, and Mg is substituted with Zn, Be or the like can also be used. Of these, since MgO and $MgAl_2O_4$ are materials that can realize coherent tunneling, spin can be efficiently injected. Further, when the nonmagnetic layer 102 is formed of a metal, Cu, Au, Ag, or the like can be used as the material.

Also, it is preferable that the cap layer 104 be formed on a surface of the first ferromagnetic metal layer 101 on a side opposite to the nonmagnetic layer 102 as shown in FIG. 3. The cap layer 104 can inhibit diffusion of elements from the first ferromagnetic metal layer 101. The cap layer 104 also contributes to crystal orientation of each layer of the magnetoresistive effect element portion 105. As a result, by providing the cap layer 104, magnetism of the second ferromagnetic metal layer 103 and the first ferromagnetic metal layer 101 of the magnetoresistive effect element portion 105 is stabilized, and the resistance of the magnetoresistive effect element portion 105 can be lowered.

For the cap layer 104, it is preferable to use a material having high conductivity. For example, Ru, Ta, Cu, Ag, Au, or the like can be used. It is preferable that the crystal structure of the cap layer 104 be appropriately set using a face-centered cubic (fcc) structure, a hexagonal close-packed (hcp) structure, or a body-centered cubic (bcc) structure in accordance with a crystal structure of the adjacent ferromagnetic metal layer.

Also, it is preferable to use any one selected from the group consisting of Ag, Cu, Mg, and Al for the cap layer 104. As will be described in detail below, when the spin-orbit torque wiring 120 and the magnetoresistive effect element portion 105 are connected to each other via the cap layer 104, it is preferable that the cap layer 104 does not dissipate spin transferred from the spin-orbit torque wiring 120. It is known that silver, copper, magnesium, aluminum, and the like have a long spin diffusion length of 100 nm or more, and do not easily dissipate spin.

The thickness of the cap layer 104 is preferably equal to or less than a spin diffusion length of a material forming the cap layer 104. When the thickness of the cap layer 104 is equal to or less than the spin diffusion length, the spin transferred from the spin-orbit torque wiring 120 can be sufficiently transferred to the magnetoresistive effect element portion 105. Further, when the spin of the spin-orbit torque wiring can be injected into the first ferromagnetic metal layer, a layer other than the cap layer 104 may be interposed between the first ferromagnetic metal layer and the spin-orbit torque wiring. For such a layer, Ag, Cu, Mg, and Al with a thickness of about 0.5 to 2.0 nm are exemplary examples.

<Substrate>

The substrate 110 is preferably highly flat. In order to obtain a highly flat surface, for example, Si, AlTiC, or the like can be used as a material thereof.

An underlayer (not shown) may be formed on a surface of the substrate 110 on the magnetoresistive effect element portion 105 side. When the underlayer is provided, it is possible to control crystalline properties of each layer including the second ferromagnetic metal layer 103 laminated on the substrate 110 such as crystal orientation, crystal grain size, or the like.

It is preferable that the underlayer have insulation properties. This is to prevent dissipation of a current flowing through the wiring 130 or the like. Various materials can be used for the underlayer. For example, as one example, a nitride layer having a (001)-oriented NaCl structure and containing at least one element selected from a group of Ti, Zr, Nb, V, Hf, Ta, Mo, W, B, Al, and Ce can be used for the underlayer.

As another example, a layer of a (002)-oriented perovskite-based conductive oxide expressed by a composition formula $XYO_3$ can be used for the underlayer. Here, the sites X contain at least one element selected from a group of Sr, Ce, Dy, La, K, Ca, Na, Pb, and Ba, and the sites Y contain at least one element selected from the group consisting of Ti, V, Cr, Mn, Fe, Co, Ni, Ga, Nb, Mo, Ru, Ir, Ta, Ce, and Pb.

As another example, an oxide layer having a (001)-oriented NaCl structure and containing at least one element selected from the group consisting of Mg, Al, and Ce can be used for the underlayer.

As another example, a layer having a (001)-oriented crystal structure or a cubic crystal structure and containing at least one element selected from a group of Al, Cr, Fe, Co, Rh, Pd, Ag, Ir, Pt, Au, Mo, and W can be used for the underlayer.

Further, the underlayer is not limited to one layer, and may have a plurality of layers in which layers of the above-described examples are laminated. By improving a structure of the underlayer, crystalline properties of each layer of the magnetoresistive effect element portion 105 can be enhanced, and the magnetic characteristics can be improved.

<Wiring>

The wiring 130 is electrically connected to the second ferromagnetic metal layer 103 of the magnetoresistive effect element portion 105 so that the wiring 130, the spin-orbit torque wiring 120, and a power supply (not shown) form a closed circuit in FIG. 3 to cause a current to flow in the lamination direction of the magnetoresistive effect element portion 105.

The wiring 130 is not particularly limited as long as it is of a highly conductive material. For example, aluminum, silver, copper, gold, or the like can be used.

In the above-described embodiment, although a so-called bottom pin structure in which the first ferromagnetic metal layer 101 that is laminated later and disposed on a side far from the substrate 110 is a magnetization free layer, and the second ferromagnetic metal layer 103 that is laminated first and disposed on a side close to the substrate 110 is a magnetization fixed layer (pin layer) in the magnetoresistive effect element 100 is an exemplary example, the structure of the magnetoresistive effect element 100 is not particularly limited, and may be a so-called top pin structure.

<Power Supply>

The magnetoresistive effect element 100 further includes a first power supply 140 which causes a current to flow in the lamination direction of the magnetoresistive effect element portion 105, and a second power supply 150 which causes a current to flow through the spin-orbit torque wiring 120.

The first power supply 140 is connected to the wiring 130 and the spin-orbit torque wiring 120. The first power supply 140 can control a current flowing in the lamination direction of the magnetoresistive effect element 100.

The second power supply 150 is connected to both ends of the spin-orbit torque wiring 120. The second power supply 150 can control a current flowing in the spin-orbit torque wiring 120 which is a current flowing in a direction perpendicular to the lamination direction of the magnetoresistive effect element portion 105.

As described above, the current flowing in the lamination direction of the magnetoresistive effect element portion 105 induces an STT. In contrast, the current flowing in the spin-orbit torque wiring 120 induces an SOT. Both the STT and the SOT contribute to magnetization reversal of the first ferromagnetic metal layer 101.

In this manner, when an amount of the current flowing in the lamination direction of the magnetoresistive effect element portion 105 and an amount of the current flowing in the direction perpendicular to the lamination direction are controlled by the two power supplies, a ratio between contributions of the SOT and the STT contributing to the magnetization reversal can be freely controlled.

For example, when a large current cannot flow through a device, control can be performed such that an STT with high energy efficiency for magnetization reversal is mainly used. That is, the amount of current flowing from the first power supply 140 can be increased, and the amount of current flowing from the second power supply 150 can be reduced.

Further, for example, when it is necessary to manufacture a thin device and a reduction in a thickness of the nonmagnetic layer 102 is inevitable, the current flowing through the nonmagnetic layer 102 is required to be reduced. In this case, the amount of current flowing from the first power supply 140 is reduced, the amount of current flowing from the second power supply 150 is increased, and thereby the contribution fraction of SOT is increased.

A known power supply can be used for the first power supply 140 and the second power supply 150.

As described above, according to the magnetoresistive effect element of the present disclosure in a case of a configuration in which the STT method and the SOT method are used in combination, a ratio between contributions of the STT and the SOT can be freely controlled by the amount of current supplied from the first power supply and the second power supply. Therefore, a ratio between contributions of the STT and the SOT can be freely controlled in accordance with a performance required for a device, and thus this can function as a magnetoresistive effect element having a higher general versatility.

(Manufacturing Method)

A manufacturing method of the spin current magnetization reversal element and the magnetoresistive effect element having the same is not particularly limited, and a known method can be used. For example, physical vapor deposition (PVD) methods such as resistance heating deposition, electron beam evaporation, a molecular beam epitaxy (MBE) method, an ion plating method, an ion beam deposition method, or a sputtering method can be used as a film forming method. Alternatively, chemical vapor deposition (CVD) methods such as a thermal CVD method, a photo CVD method, a plasma CVD method, a metal-organic chemical vapor deposition (MOCVD) method, or an atomic layer deposition (ALD) method can also be used. Further, a single-atom layer doping method (delta-doping method) can be used to form an ultra-thin interface spin generation layer with a thickness equal to or less than twice an atomic radius. Hereinafter, an example of a manufacturing method of a magnetoresistive effect element to which a spin-orbit torque magnetization reversal element is applied will be described, and this will also serve as description of a manufacturing method of the spin-orbit torque magnetization reversal element.

First, a spin-orbit torque wiring is fabricated on a substrate serving as a support. For example, a spin conduction layer is formed using an MBE method. On top of this, for example, an interface spin generation layer is formed using a sputtering method adjusted to a low film forming rate. Thereafter, a spin conduction layer is further formed thereon, and, by repeating these steps described above, a laminated body in which the spin conduction layers and the interface spin generation layers are alternately laminated is obtained. Next, a spin-orbit torque wiring is processed into a predetermined shape using a photolithography technique or the like.

Then, a portion other than the spin-orbit torque wiring is covered with an insulating film such as an oxide film. It is preferable to polish an exposed surface of the spin-orbit torque wiring and the insulating film by chemical mechanical polishing (CMP).

Next, a magnetoresistive effect element is fabricated. The magnetoresistive effect element is fabricated using a sputtering method, for example. In a case in which a magnetoresistive effect element is a tunnel magnetoresistive (TMR) element, for example, a tunnel barrier layer is formed on a first ferromagnetic metal layer by first sputtering a metal thin film of about 0.4 to 2.0 nm from which bivalent cations of magnesium, aluminum, and a plurality of nonmagnetic elements are ejected, performing plasma oxidation or natural oxidation by introducing oxygen, and subsequent heat treatment.

It is preferable to perform annealing treatment on the obtained laminated film. The layer formed by reactive sputtering is amorphous and needs to be crystallized. For example, when Co—Fe—B is used as the ferromagnetic metal layer, a portion of B is crystallized by being annealed.

A magnetoresistive ratio improves in the magnetoresistive effect element fabricated by annealing treatment as compared with a magnetoresistive effect element fabricated without annealing treatment. It is thought that this is because uniformity of crystal sizes and an orientation in the tunnel barrier layer of the nonmagnetic layer are improved.

For the annealing treatment, it is preferable that heating be performed in an inert atmosphere such as Ar at a temperature of 300° C. or more and 500° C. or less for 5 minutes or more and 100 minutes or less, and then heating be performed in a state in which a magnetic field of 2 kOe or more and 10 kOe or less is applied at a temperature of 100° C. or more and 500° C. or less for 1 hour or more and 10 hours or less.

As a method of forming the magnetoresistive effect element into a predetermined shape, a processing means such as photolithography can be used. First, the magnetoresistive effect element is laminated, and then a resist is applied on a surface of the magnetoresistive effect element on a side opposite to the spin-orbit torque wiring. Then, a predetermined portion of the resist is cured to remove unnecessary portions of the resist. The portion in which the resist has been cured serves as a protective film of the magnetoresistive effect element. The portion in which the resist has been cured has the same shape as that of a finally obtained magnetoresistive effect element.

Then, a process such as ion milling, reactive ion etching (RIE), or the like is performed on the surface on which the protective film is formed. A portion in which the protective film is not formed is removed, and thereby a magnetoresistive effect element with a predetermined shape is obtained.

The present disclosure is not necessarily limited to the configuration and manufacturing method of the spin-orbit torque magnetization reversal element according to the above embodiments, and various modifications can be added without departing from the gist of the present disclosure.

(Magnetic Memory)

A magnetic memory (MRAM) according to one embodiment of the present disclosure includes a plurality of magnetoresistive effect elements according to the above-described embodiment of the present disclosure.

(Magnetization Reversal Method)

In the magnetoresistive effect elements according to the above-described embodiment of the present disclosure, when magnetization reversal is performed, a current density of a current flowing in the spin-orbit torque wiring is preferably less than $1 \times 10^7$ A/cm$^2$. When the current density of the current flowing in the spin-orbit torque wiring is excessively large, heat is generated due to the current flowing through the spin-orbit torque wiring. When heat is applied to the second ferromagnetic metal layer, the magnetization stability of the second ferromagnetic metal layer is lost, and unexpected magnetization reversal or the like may occur. When such an unexpected magnetization reversal occurs, a problem in which recorded information is rewritten occurs. That is, in order to avoid an unexpected magnetization reversal, it is preferable that the current density of the current flowing in the spin-orbit torque wiring not be excessively large. When the current density of the current flowing in the spin-orbit torque wiring is less than $1 \times 10^7$ A/cm$^2$, it is possible to avoid an occurrence of magnetization reversal at least due to generated heat.

In the magnetoresistive effect element according to the embodiment of the present disclosure, in a case of a configuration in which the STT method and the SOT method are used in combination, the magnetization reversal method may be performed by applying a current to a power supply of the magnetoresistive effect element after applying a current to a power supply of the spin-orbit torque wiring.

The SOT magnetization reversal step and the STT magnetization reversal step may be performed at the same time, or the STT magnetization reversal step may be additionally performed after the SOT magnetization reversal step is performed in advance. A current may be supplied simultaneously from the first power supply 140 and the second power supply 150 or a current may be supplied from the first power supply 140 after a current is supplied from the second power supply 150, but it is preferable to apply a current to the power supply of the magnetoresistive effect element after a current is applied to the power supply of the spin-orbit torque wiring in order to reliably obtain an assistance effect of the magnetization reversal using the SOT. In other words, it is preferable to supply a current from the second power supply 150, and then additionally supply a current from the first power supply 140.

INDUSTRIAL APPLICABILITY

According to the spin current magnetization rotating element of the present disclosure, a current density required for the magnetization rotation can be reduced, and furthermore, the power consumption can also be reduced.

REFERENCE SIGNS LIST

1 First ferromagnetic metal layer
2 Spin-orbit torque wiring
3 Spin conduction layer
4 Interface spin generation layer
10 Spin current magnetization rotating element (spin current magnetization reversal element)
100 Magnetoresistive effect element
101 First ferromagnetic metal layer
102 Nonmagnetic layer
103 Second ferromagnetic metal layer
104 Cap layer
105 Magnetoresistive effect element portion
110 Substrate
120 Spin-orbit torque wiring
130 Wiring
140 First power supply
150 Second power supply

What is claimed is:

1. A spin current magnetization rotating element comprising:
a first ferromagnetic metal layer in which a magnetization direction changes; and
a spin-orbit torque wiring extending in a second direction intersecting a first direction which is a direction perpendicular to a surface of the first ferromagnetic metal layer and having one surface on which the first ferromagnetic metal layer is positioned, wherein
the spin-orbit torque wiring has a structure in which a spin conduction layer and an interface spin generation layer are alternately laminated in the first direction, and
one of the spin conduction layers in the spin-orbit torque wiring is in closest proximity to the first ferromagnetic metal layer.

2. The spin current magnetization rotating element according to claim 1, wherein a thickness of the interface spin generation layer is equal to or less than twice an atomic radius of atoms forming the interface spin generation layer.

3. The spin current magnetization rotating element according to claim 2, wherein the interface spin generation layer is formed of a material containing any one element selected from the group consisting of Mo, Ru, Rh, Pd, Ta, W, Ir, Pt, Au, and Bi.

4. The spin current magnetization rotating element according to claim 2, wherein a thickness of the spin conduction layer is a thickness equal to or less than a spin diffusion length of the spin conduction layer.

5. The spin current magnetization rotating element according to claim 2, wherein the spin-orbit torque wiring includes two or more layers of the interface spin generation layers.

6. The spin current magnetization rotating element according to claim 2, wherein
the spin conduction layers sandwiching the interface spin generation layer are formed of materials different from each other, and
a spin resistivity of the spin conduction layer close to the first ferromagnetic metal layer is smaller than a spin resistivity of the spin conduction layer which is distant from the first ferromagnetic metal layer.

7. The spin current magnetization rotating element according to claim 1, wherein the spin conduction layer is formed of a material containing at least any one element selected from the group consisting of Al, Si, Cu, Ag, GaAs, and Ge.

8. The spin current magnetization rotating element according to claim 7, wherein the interface spin generation layer is formed of a material containing any one element selected from the group consisting of Mo, Ru, Rh, Pd, Ta, W, Ir, Pt, Au, and Bi.

9. The spin current magnetization rotating element according to claim 7, wherein the spin-orbit torque wiring includes two or more layers of the interface spin generation layers.

10. The spin current magnetization rotating element according to claim 1, wherein the interface spin generation layer is formed of a material containing any one element selected from the group consisting of Mo, Ru, Rh, Pd, Ta, W, Ir, Pt, Au, and Bi.

11. The spin current magnetization rotating element according to claim 10, wherein the spin-orbit torque wiring includes two or more layers of the interface spin generation layers.

12. The spin current magnetization rotating element according to claim 1, wherein a thickness of the spin conduction layer is a thickness equal to or less than a spin diffusion length of the spin conduction layer.

13. The spin current magnetization rotating element according to claim 12, wherein the spin-orbit torque wiring includes two or more layers of the interface spin generation layers.

14. The spin current magnetization rotating element according to claim 1, wherein the spin-orbit torque wiring includes two or more layers of the interface spin generation layers.

15. The spin current magnetization rotating element according to claim 1, wherein a thickness of the interface spin generation layer at a position closest to the first ferromagnetic metal layer is smaller than a thickness of the other interface spin generation layers in the interface spin generation layers.

16. The spin current magnetization rotating element according to claim 1, wherein
the spin conduction layers sandwiching the interface spin generation layer are formed of materials different from each other, and
a spin resistivity of the spin conduction layer close to the first ferromagnetic metal layer is smaller than a spin resistivity of the spin conduction layer which is distant from the first ferromagnetic metal layer.

17. The spin current magnetization rotating element according to claim 1, wherein a thickness of the spin-orbit torque wiring is equal to or less than 20 nm.

18. A magnetoresistive effect element comprising:
the spin current magnetization rotating element according to claim 1;
a second ferromagnetic metal layer in which a magnetization direction is fixed; and
a nonmagnetic material layer sandwiched between the first ferromagnetic metal layer and the second ferromagnetic metal layer.

19. A magnetic memory comprising a plurality of magnetoresistive effect elements according to claim 18.

* * * * *